United States Patent [19]

Mayernik

[11] Patent Number: 5,429,861
[45] Date of Patent: Jul. 4, 1995

[54] ELECTROLESS COPPER DEPOSITED ON A PRINTED CIRCUIT BOARD CAPABLE OF WITHSTANDING THERMAL CYCLING

[75] Inventor: Richard A. Mayernik, Newark, Del.

[73] Assignee: AMP-AKZO Corporation, Newark, Del.

[21] Appl. No.: 144,823

[22] Filed: Oct. 28, 1993

Related U.S. Application Data

[62] Division of Ser. No. 924,842, Aug. 4, 1992, Pat. No. 5,258,200.

[51] Int. Cl.$^6$ ................................................. B32B 9/00
[52] U.S. Cl. ..................................... 428/209; 428/901; 361/748
[58] Field of Search ................. 428/209, 901, 457; 427/8; 423/24; 361/748, 751

[56] References Cited

U.S. PATENT DOCUMENTS

| | | | |
|---|---|---|---|
| 3,310,430 | 3/1967 | Schneble | 106/1.23 |
| 3,485,643 | 12/1969 | Zeblisky | 427/306 |
| 3,615,732 | 10/1971 | Shipley | 106/1.23 |
| 3,615,735 | 10/1971 | Shi | 106/1.26 |
| 3,959,351 | 5/1976 | Day | 560/51 |
| 4,563,217 | 1/1986 | Kikuchi | 427/437 |
| 4,632,852 | 12/1986 | Akahoshi | 427/437 |
| 4,650,691 | 3/1987 | Kinoshita | 427/8 |
| 4,666,683 | 5/1987 | Brown | 423/24 |
| 4,695,505 | 9/1987 | Dutlewych | 428/209 |
| 4,865,888 | 9/1989 | Akahoshi | 427/443.1 |
| 4,970,107 | 11/1990 | Akahoshi | 428/209 |
| 5,256,441 | 10/1993 | Huenger | 427/8 |
| 5,258,200 | 11/1993 | Mayernik | 427/8 |

FOREIGN PATENT DOCUMENTS

| 2083080 | 3/1982 | United Kingdom | 427/437 |

*Primary Examiner*—Patrick J. Ryan
*Assistant Examiner*—Patrick Jewik
*Attorney, Agent, or Firm*—Morgan & Finnegan

[57] ABSTRACT

An improved method of manufacturing fully-additive or partly-additive printed wiring boards by electrolessly depositing copper on an insulating substratum and the walls of plated-through holes, wherein the copper deposit has increased resistance to failure due to thermal stress or thermal cycling. The electroless copper plating bath contains a copper compound, ethylenediaminetetraacetic acid as a complexing agent for copper, a reducing agent capable of reducing the copper compound to metallic copper and addition agents selected from inorganic germanium and silicate compounds and combined with a polyethylene glycol. The pH of the electroless copper bath is monitored and maintained between 11.2 and 12.0 to reduce the trace iron codeposited with the copper and improve the resistance to plated-through hole failure in thermal cycling. The addition of vanadium to the electroless copper bath increases the smoothness of the deposited copper and further increases the number of thermal cycles before failure.

11 Claims, No Drawings

ELECTROLESS COPPER DEPOSITED ON A PRINTED CIRCUIT BOARD CAPABLE OF WITHSTANDING THERMAL CYCLING

This is a divisional of application Ser. No. 07/924,842 filed Aug. 4, 1992 now U.S. Pat. No. 5,258,200.

FIELD OF THE INVENTION

This invention concerns electroless copper deposition and its use in the manufacture of additive printed wiring boards. More specifically, it concerns an improvement in a method of manufacturing an electroless copper deposit and the electrolessly deposited copper with improved smoothness and elongation.

BACKGROUND OF THE INVENTION

U.S. Pat. No. 4,632,852 to Akahoshi et al. describes an electroless copper plating process for additive printed wiring boards. The copper deposits obtained are described as having tensile strengths of 276 to 442 Pa and elongation on 30 μm thick test strips ranging from 3.8% to 11.1%. The electroless copper plating solutions are operated at temperatures of 40°-80° C., a sodium hydroxide concentration which will give a pH of 12.8 (measured at 25° C.), and are characterized by the stabilizers comprising 1-1000 mg/L of silicon or germanium in the solution and at least 0.01 L/min per liter of injected air per liter of plating solution.

U.S. Pat. No. 4,865,888 to Akahoshi et al. describes an improvement in the process of U.S. Pat. No. 4,632,852 wherein the air is injected in fine bubbles with a bubble diameter of 1 mm or less.

The copper deposits formed by the processes of U.S. Pat. Nos. 4,632,852 and 4,865,888 have a rough surface. Because many additive printed wiring applications require a smooth surface, the surface roughness of the copper limits its use. The roughness of the deposits is demonstrated in U.S. Pat. No. 4,970,107 to Akahoshi et al. which describes a process wherein the electroless copper deposition bath described in U.S. Pat. No. 4,632,852 is employed to plate over a smooth copper surface with an electroless copper deposit to a thickness of 5 μm. The surface thus produced has knife-shaped projections for improving the bond when the copper surface is laminated in a multilayer printed wiring board. An additive selected from oxoacids of silicon, germanium, vanadium or carbon is employed in the electroless bath to promote formation of the knife-shaped projections.

U.S. Pat. No. 3,959,351 to Schneble et al. indicates that iron in electroless copper deposition solutions should be below 25 mg/l, preferably below 10 mg/l in order to reduce extraneous copper deposits and avoid spontaneous decomposition of the plating solution. There is no teaching in U.S. Pat. No. 3,959,351 that trace quantities of codeposited iron affect the physical properties of the electrolessly deposited copper. The control of the iron content was important only for the stability of the electroless copper bath, not for the quality of the copper deposit.

U.S. Pat. No. 3,485,643 to Zeblisky et al. describes hexacyanoferrates as stabilizers in electroless copper deposition solutions. U.S. Pat. No. 4,650,691 to Kinoshita et al. reports that the hexacyanoferrates decompose in the plating bath and that the decomposition products inhibit further electroless copper plating and form precipitates in the bath. Kinoshita et al. indicate that the use of triethanolamine at one to three times the molar concentration of the hexacyanoferrate in the electroless bath will prevent destruction of the bath by inhibition of the plating reaction and the formation of precipitates. The use of triethanolamine is taught for preventing iron precipitation in the plating solution, and not for improving the quality of the copper deposit.

U.S. Pat. No. 3,310,430 to Schneble et al. describes electroless copper baths containing a vanadium compound as a hydrogen inclusion retarding agent. Copper is deposited as thin foils (5-12 μm thick) with sufficient ductility to permit folding the foils in half, creasing them and unfolding the foils up to 5 times before the foil breaks at the crease.

U.S. Pat. No. 4,563,217 to Kikuchi et al. describes electroless copper baths comprising a cationic wetting agent and an inorganic compound containing silicon, germanium or vanadium to improve the stability of the plating bath and tensile strength and percent elongation of the deposited copper. The copper deposits reported had tensile strengths of 324-657 MPa and percent elongation for 50 μm thick foils of 2-7%. If these percent elongations are normalized to copper foil 30 μm thick, the range would be 2-5%.

SUMMARY OF THE INVENTION

This invention comprises an improved method of electrolessly depositing copper from a plating bath containing a copper compound, EDTA as the complexing agent for copper, a reducing agent for copper, a pH-adjusting agent, an additive selected from the group consisting of soluble inorganic silicon compounds and soluble inorganic germanium compounds, and in which method an oxygen containing gas is injected into the plating bath. The improvement produces a copper deposit on a printed wiring board having at least one plated-through hole and capable of withstanding 25 repetitive thermal cycles without failures or an increase of more than 10% in the resistance of the plated-through hole. Each thermal cycle consists of immersion in water at 25° C. followed by immersion in a fluidized sand bed at 260° C. The improvement comprises monitoring and maintaining the pH of the plating bath in the range of 11.2 to 12 when measured at 25° C. so that the content of trace iron in the deposited copper layer is maintained below 1.5 mg per mole copper.

In one embodiment, the plating bath further comprises a complexing agent for iron in an amount sufficient to complex the iron in the plating bath and limit codeposited iron in the copper layer to less than 1.5 mg per mole copper.

In another embodiment, the invention comprises the further improvement of increasing the smoothness and/or increasing the ductility of the formed copper deposit. Smoothness is increased by adding to the plating bath a vanadium compound in an amount sufficient to reduce the roughness of the surface of the deposited copper layer to no greater than 1 micron. Ductility of the formed copper deposit is increased by adding to the plating bath a vanadium compound in an amount sufficient to increase the percent elongation of the deposited copper layer to 1.5 to 2 times the percent elongation of a copper deposit from a comparable plating bath without the vanadium compound and in an amount sufficient to withstand at least 30 of the repetitive thermal cycles.

Thus, the plating bath is operated to deposit copper having a smooth surface, high ductility and a trace iron content less than 1.5 mg per mole by controlling the concentration of the pH-adjusting agent to maintain a pH of 11.2–12.0 when measured at 25° C., and increasing the smoothness and ductility of the copper deposit by operating the plating bath with an addition agent comprising a vanadium compound.

In another embodiment, the invention comprises a method of manufacturing printed wiring boards, wherein the plating bath is operated to deposit copper for a printed wiring board. In particular, the plating bath is used to deposit the conductive pattern of a printed wiring board in a fully-additive process, or the copper deposit on the hole walls in a "partly-additive" process.

DETAILED DESCRIPTION OF THE INVENTION

This invention is concerned with improvements in the products, processes and electroless copper plating baths described in U.S. Pat. Nos. 4,632,852 and 4,865,888, the disclosures of which are incorporated herein by reference.

It has been found that limiting the codeposited iron content of electrolessly deposited copper to less than 1.5 mg iron per mole of copper substantially improves the quality of the deposited copper in ductility, and percent elongation and the resistance to thermal stress and thermal cycling of copper plated-through holes. Preferably, the trace iron content of the deposited copper should be less than 0.8 mg per mole of deposited copper. Applicant has found that following such teaching substantially improves the ductility of the formed copper deposit as indicated by a three to four fold increase in the percent elongation as compared to a comparable plating bath at a higher pH. Further, it has been found that when the iron content is maintained below 1.5 mg per mole copper, copper deposits on printed wiring boards can withstand the thermal stress of four, 10 second, solder cycles at 288° C.

The amount of codeposited iron depends on the strength of the iron complex present in the electroless copper plating bath. It has been found that for electroless copper plating baths comprising ethylenediaminetetraacetic acid (EDTA) as the complexing agent for copper, the optimum plating for minimum iron in electrolessly deposited copper is obtained when the plating bath has a pH of 11.2 to 12 (measured at 25° C.).

Additional complexing agents that sequester iron preferentially can be added to the plating bath as addition agents to extend the operating range. Such complexing addition agents should form a soluble complex with iron (III) at the operating temperature and pH of the plating bath. The complexing addition agent should sequester iron (III) more strongly than copper. Suitable complexing addition agents include bicine (N,N-bis(2-hydroxyethyl)glycine) which preferentially sequesters iron (III) but not copper (II). Complexing addition agents that strongly sequester copper (II) may be utilized in plating baths where the main complexing agent for copper forms a stronger complex with copper than the complexing addition agent, so that the complexing addition agent remains free to sequester iron (III).

It now has been found that additive printed wiring boards with plated-through holes in which the electroless copper deposits contain trace iron in excess of 1.5 mg per mole copper fail in thermal shock and/or thermal cycling tests.

Further it has been found that the addition of small amounts of vanadium compounds to certain plating bath formulations following applicant's invention further improves the ductility of the copper deposit so that the percent elongation of the copper deposit is increased to 1.5 to 2 times the percent elongation of a copper produced by a comparable plating bath without the vanadium compound.

Applicant also has found that the addition of small amounts of vanadium compound to the electroless copper plating bath surprisingly eliminates the characteristic surface roughness of the copper deposits formed in electroless plating baths stabilized by germanium or silicate compounds and a polyethylene glycol. The surface roughness is reduced to no greater than 1 $\mu$m. These smooth deposits, from the use of a vanadium addition agent combined with a germanium or silicate addition agent, are particularly unexpected, in view of the teaching of Akahoshi et al., U.S. Pat. No. 4,970,107, that vanadium addition agents produce knife-shaped projections in the copper deposit.

In the electroless copper plating baths described in all of the aforementioned Akahoshi et al. patents, the standard sodium hydroxide concentration is adjusted to provide a pH of 12.5–12.8 at 25° C. (0.03–0.06 mole of free hydroxide). It now has been discovered that deposits from electroless copper plating baths operated at lower hydroxide concentrations, to give a pH of 11.2–12.0 at 25° C. (0.002–0.010 mole of free hydroxide), preferably a pH of 11.7–11.9 at 25° C. (free hydroxide concentration of 0.005–0.008 mole per liter), surprisingly have a trace iron content an order of magnitude less than that of deposits from the same copper plating baths operated at the standard hydroxide concentrations of the prior art (0.03–0.06 M or a pH of 12.5–12.8 at 25° C.).

Correspondingly, the copper deposits from the plating baths with the low hydroxide concentration have higher tensile strength and percent elongation. Additive printed wiring boards with plated-through holes plated by the electroless copper plating baths with lower sodium hydroxide content withstand thermal shock tests and thermal cycling better than the additive printed wiring boards with plated-through holes plated in the conventional plating baths described by Akahoshi et al.

A source of trace iron in the electroless copper plating bath is the copper salt used as a source of copper in the plating bath, and used to replenish the plating bath and replace the copper electrolessly deposited. Copper sulfate is commonly selected for replenishment of electroless copper plating baths in manufacturing facilities as it is the purest copper salt commercially available. Most electroless copper plating baths are operated in a "bail-out" mode in which by-product sulfate in the plating bath is controlled by discarding a portion of the plating bath and replacing the discarded portion with an equal volume of fresh, by-product free plating bath. The concentration of the iron in the electroless copper plating bath will depend on the iron concentration, mg Fe/mol Cu, in the copper sulfate replenishment solution, and will be approximately equal to the mg Fe/mol $SO_4^=$ in the electroless plating bath. If the by-product sulfate concentration is maintained at 0.25 mol/L, the copper sulfate used to replenish the electroless plating bath should have an iron concentration no higher than 10 mg iron per mole copper and preferably no higher than 5 mg per mole copper.

The copper concentration in the electroless plating bath is 0.02–0.08 mol/L, preferably 0.03–0.06 mol/L, and most preferably 0.036–0.048 mol/L. The copper concentration in the plating bath is replenished to maintain the copper concentration as copper is deposited from the plating bath. If the copper compound in the replenishment solution contains more than 10 mg of iron per mole of copper, an iron complexing addition agent may be needed. Preferably, the copper replenishment solution will contain less than 10 mg of iron per mole of copper and more preferably, less than 5 mg of iron per mole of copper.

When an iron complexing agent is required, the concentration of the iron complexing agent should be 1–10 millimoles per millimole of iron. When bicine is used as the iron complexing agent suitable concentrations are 0.5–1 g/L in the copper deposition bath.

The concentration of the copper complexing agent in the copper deposition bath should be 0.06–0.15 mol/L, and preferably 0.08–0.12 mol/L. When the concentration of the complexing agent is too low, the bath deposits copper outside of the conductor pattern; when it is too high, the plating rate slows down.

The formaldehyde concentration is 0.04–0.9 mol/L; preferably 0,045–0,067 mol/L, and more preferably 0.053–0.060 mol/L. The formaldehyde replenishment solution should contain less than 0.2 mg of iron per mole formaldehyde, and preferably less than 0.1 mg per mole formaldehyde.

The hydroxide replenishment solution should contain less than 0.3 mg of iron per mole hydroxide, and preferably less than 0.15 mg of iron per mole hydroxide.

The electroless copper plating bath may contain as stabilizers from 10–1000 mg/L of a soluble inorganic silicon compound in terms of silicon atom or 10–1000 mg/L of an inorganic germanium compound in terms of germanium atom in conjunction with a polyoxyethylene compound. Preferably, the electroless copper plating bath will contain as stabilizers from 25–100 mg/L of germanium or in conjunction with a polyoxyethylene compound. Plating baths with less than 25 mg/L germanium are significantly less stable. Plating baths operated with germanium concentrations up to 250 mg/L may produce deposits with a slight improvement in percent elongation, but the plating rate decreases when the germanium concentration is above 100 mg/L.

The concentration of compounds containing polyoxyethylene in the plating solution should be equivalent to 5–50 ethylene oxide units per liter. Preferably, the polyoxyethylene compound is selected from the group of ethylene glycol polymers with a molecular weight between 250 and 250,000 daltons. More preferably, the polymer has a molecular weight between 600 and 2000 daltons, and most preferably between 800 and 1400 daltons. Ethylene glycol polymers are used at a concentration of 0.1–10 g/L; preferably 0.5–4 g/L, and more preferably 1–2 g/L.

The concentration of vanadium in the plating bath should be 0.5–2.5 mg/L. There is no significant increase in the smoothness or percent elongation of the copper deposited from plating baths containing less than 0.5 mg/L vanadium. Deposits from plating baths containing greater than 2.5 mg/L vanadium exhibit a percent elongation comparable to deposits from plating baths containing lower vanadium concentrations, but the plating rate is approximately 60% slower.

Fine air bubbles should be introduced into the electroless copper plating bath at a rate of 0.04–3 liters of air per minute per liter of plating bath; and preferably at a rate of 0.06–0.1 liters of air per minute per liter of plating bath.

The present invention is further illustrated in the examples below. In the examples, the copper deposits varied in thickness. The standard tensile strength calculation included a correction for the thickness of the deposit, but the standard percent elongation did not. In the examples, the percent elongation of deposits with varying thicknesses was compared by normalizing the thicknesses to 30 $\mu$m.

Also, in the examples, the pH, formaldehyde and copper concentration and air injection and the plating bath temperatures were monitored and maintained at the stated values.

EXAMPLE 1

As a comparison to applicant's invention, an electroless copper plating bath was operated with the following formulation according to the procedures of U.S. Pat. Nos. 4,632,852 and 4,970,107:

| | | |
|---|---|---|
| $CuSO_4.5H_2O$ | g/L | 10 |
| $Na_4EDTA.2H_2O$ | g/L | 41 |
| NaOH | pH at 25° C. | 12.5 |
| Formaldehyde (37% solution) | mL/L | 2.2 |
| By-product $Na_2SO_4$ | mol/L | 0.25 |
| By-product NaOOCH | mol/L | 0.5 |
| Polyoxyethylene (MW = 1000) | g/L | 1 |
| $GeO_2$ | mg/L | 70 |
| Air injection (large bubbles) | L/min/L (bath) | 0.07 |
| Air injection (fine bubbles) | L/min/L (bath) | 0.14 |
| Temperature | °C. | 72 |

Large air bubbles came from a pipe with 0.6 mm diameter holes. Fine air bubbles came from a porous walled pipe.

The plating bath was operated with a load of 1.5 dm$^2$ of surface being plated per liter. Copper was deposited on printed wiring boards and also on a stainless steel substratum to obtain a foil suitable for tensile testing. The rate of copper deposition was 6–7 $\mu$m/hr.

The plated-through holes in the printed wiring boards were subjected to the fluid sand thermal cycling test described in IPC TECHNICAL REPORT, IPC-TR-579, ROUND ROBIN RELIABILITY EVALUATION OF SMALL DIAMETER PLATED THROUGH HOURS IN PRINTED WIRING BOARDS. Lincolnwood, Ill.: Institute for Interconnecting and Packaging Electronic Circuits, 1988, p25. In one cycle of the test, printed wiring boards are immersed in water at 25° C., withdrawn and the excess water removed, and immersed in a fluidized sand bath at 260° C. The boards are cycled to failure, which is an open circuit or a 10% increase in the resistance of the chain of plated-through holes. Thirty cycles without failure is considered equivalent to passing 400 cycles of MIL-STD-202 thermal cycle test.

The printed wiring boards prepared in electroless copper plating baths according to this formulation failed after 19 repetitive thermal cycles, on average.

The same plating bath (prepared according to the procedures of U.S. Pat. Nos. 4,632,852 and 4,970,107) was modified according to this invention. The pH of the electroless copper plating bath was lowered to 11.8 and the plating bath was operated with the following formulation:

| | | |
|---|---|---|
| $CuSO_4.5H_2O$ | g/L | 10 |
| $Na_4EDTA.2H_2O$ | g/L | 41 |
| NaOH | pH at 25° C. | 11.8 |

| -continued | | |
|---|---|---|
| Formaldehyde (37% solution) | mL/L | 3.8 |
| By-product Na₂SO₄ | mol/L | 0.25 |
| By-product NaOOCH | mol/L | 0.5 |
| Polyoxyethylene (MW = 1000) | g/L | 1 |
| GeO₂ | mg/L | 70 |
| Air injection (large bubbles) | L/min/L (bath) | 0.07 |
| Air injection (fine bubbles) | L/min/L (bath) | 0.07 |
| Temperature | °C. | 72 |

The plating bath was operated with a load of 1.5 dm² of surface being plated per liter. Copper also was deposited on a stainless steel substratum to obtain a foil suitable for tensile testing. The rate of copper deposition was 6–7 μm/hr.

The plating bath was operated for two more days at pH 11.8 [measured at 25° C.].

After each day, the copper deposited on the stainless steel substratum was dried for 1 hour at 160° C. After drying, a copper foil was removed from the stainless steel. A portion of the foil was used for tensile testing, and a portion was analyzed for the trace iron content. The results comparing the same plating bath operated at a pH of 12.5 (U.S. Pat. Nos. 4,632,852 and 4,970,107) and a plating bath operated at a pH of 11.8 (a bath pH within applicant's invention) are reported in Table 1. The percent elongation is reported as measured at the deposit thickness and as normalized to a thickness of 30 μm.

TABLE 1

| Bath pH at 25° C. | Iron Conc. in the Copper mg/mol | Tensile Strength MPa | Deposit Thickness μm | % Elongation | |
|---|---|---|---|---|---|
| | | | | As Measured | Normalized to 30 μm |
| 12.5 | 3.50 | 331 | 49.5 | 2 | 2 |
| 11.8 | 0.53 | 413 | 27.2 | 6 | 7 |
| 11.8 | 0.54 | 400 | 29.2 | 8 | 8 |
| 11.8 | 0.53 | 455 | 30.5 | 9 | 9 |

EXAMPLE 2

The copper deposits produced in the plating bath formulations of Example 1 had a rough surface, which is objectionable for any printed wiring board applications using finger contacts or edge connectors. The surface roughness was 1.5–2.0 μm. The formulations described in Example 1 were modified by the addition of a vanadium compound to improve the surface finish and the ductility of the deposit. An electroless copper plating bath was operated with the following formulation:

| CuSO₄.5H₂O | g/L | 10 |
|---|---|---|
| Na₄EDTA.2H₂O | g/L | 41 |
| NaOH | pH at 25° C. | 11.8 |
| Formaldehyde (37% solution) | mL/L | 4.3 |
| By-product Na₂SO₄ | mol/L | 0.25 |
| By-product NaOOCH | mol/L | 0.5 |
| Polyoxyethylene (MW = 1000) | g/L | 1 |
| GeO₂ | mg/L | 70 |
| V₂O₅ | mg/l | 2 |
| Air injection (large bubbles) | L/min/L (bath) | 0.07 |
| Air injection (fine bubbles) | L/min/L (bath) | 0.07 |
| Temperature | °C. | 72 |

The plating bath was operated with a load of 1.5 dm² of surface being plated per liter. The rate of copper deposition was 4.5–5.5 μm/hr. The surface finish of the copper deposit was 0.5–1.0 μm. The 26 μm copper foil deposited on the stainless steel substratum was dried for 1 hour at 160° C. A tensile test was performed on the foil. The tensile strength was 345 MPa and the elongation was 18% (20% when normalized to 30 μm thick deposit).

The plating bath also was operated with work loads of 1.2 and 2.5 dm² per liter, and equivalent results were obtained.

EXAMPLE 3

Plating baths having the same formulation as Example 2 were operated on five different days to provide samples for tensile testing. After each day, the copper deposited on the stainless steel substratum was dried for 4 hours at 160° C. The results are reported in the Table 2. The percent elongation is reported as measured at the deposit thickness and as normalized to a thickness of 30 μm.

TABLE 2

| Plating Run | Deposit Thickness μm | Tensile Strength MPa | % Elongation | |
|---|---|---|---|---|
| | | | As Measured | Normalized to 30 μm |
| 1 | 26.1 ± 0.3 | 326 ± 4 | 18 ± 2 | 20 |
| 2 | 36.8 ± 0.3 | 314 ± 3 | 21 ± 2 | 18 |
| 3 | 24.1 ± 0.5 | 323 ± 6 | 14 ± 1 | 17 |
| 4 | 16.8 ± 0.3 | 318 ± 3 | 12 ± 2 | 17 |
| 5 | 24.1 ± 0.3 | 306 ± 3 | 18 ± 1 | 21 |

EXAMPLE 4

Printed wiring boards were prepared by the partly-additive process. In the partly-additive process, a 1.6 mm thick, base material, copper-clad on both sides, was drilled to provide through holes with 0.33 mm diameter; the hole walls were activated and electrolessly plated with 1–2 μm of copper; a double-sided "daisy-chain" pattern was applied with a tenting resist which covered the through holes; the conductive pattern was formed by etching, and the resist was stripped. A permanent resist was applied on both sides over the conductive pattern leaving the through holes and the lands exposed. The lands and the walls of the through holes were electrolessly plated with copper using an electroless copper plating bath operated with the low pH formulation of Example 1. After plating, the printed wiring boards were dried for 4 hours at 160° C.

The plated-through hole in the printed wiring boards were subjected to the fluid sand thermal cycling test described herein. Table 3 shows the thickness and tensile properties of the copper deposit with the results of the fluid sand thermal cycling test.

TABLE 3

| Plating Run | Deposit Thickness μm | Tensile Strength MPa | % Elongation | | Cycles To Failure |
|---|---|---|---|---|---|
| | | | As Measured | Normalized to 30 μm | |
| 1 | 51 | 273 ± 2 | 12 ± 1 | 7 | 40 |
| 2 | 53 | 241 ± 4 | 12 ± 2 | 7 | 34 |
| 3 | 48 | 262 ± 3 | 13 ± 1 | 8 | 42 |

EXAMPLE 5

Example 4 was repeated except that the hole walls were plated with an electroless copper plating bath operating with the formulation of Example 2. A sample of the copper foil was analyzed and the iron content was found to be 0.34 mg per mole copper. Table 4 below shows the thickness and tensile properties of the copper deposit and the results of the fluid sand thermal cycling test.

TABLE 4

| Plating Run | Deposit Thickness μm | Tensile Strength MPa | % Elongation As Measured | % Elongation Normalized to 30 μm | Cycles To Failure |
|---|---|---|---|---|---|
| 1 | 48 | — | — | — | 44 |
| 2 | 23 | 290 ± 5 | 10 ± 1 | 13 | 63 |
| 3 | 30 | 315 ± 3 | 17 ± 4 | 17 | 44 |

These excellent results especially for thin foils further illustrate the surprising toughness and ductility of the electroless copper deposits when a small effective amount of a vanadium compound is dissolved in the electroless copper plating bath.

COMPARATIVE EXAMPLE

Example 5 was repeated except that the electroless copper plating bath had a high trace iron content from replenishment with copper sulfate solution contaminated with 32 mg iron per mole of copper sulfate. The results of tensile testing of the copper deposited are shown in Table 5.

TABLE 5

| Plating Run | Deposit Thickness μm | Tensile Strength MPa | % Elongation As Measured | % Elongation Normalized to 30 μm | Iron in Copper Foil ppm |
|---|---|---|---|---|---|
| 1 | 23 | 455 ± 7 | 6 ± 1 | 7 | 205 |
| 2 | 29 | 434 ± 1 | 6 ± 1 | 6 | 62 |

This demonstrates that when the trace iron in the plating bath is high, even operating the electroless copper plating bath at a pH between 11.3 and 12.0 is not sufficient to maintain low iron in the deposit and the deposits obtained will have lower ductility.

EXAMPLE 6

Example 5 is repeated using the copper sulfate replenishment solution containing 32 mg iron per mole copper sulfate, but the electroless copper plating bath is modified by an iron complexing addition agent. The complexing addition agent is bicene. Five grams of bicene is added to each liter of the copper sulfate replenishment solution. Copper is electrolessly plated from the bath; the copper has high thermal shock resistance and less than 1.5 mg iron per mole of copper.

What is claimed is:

1. A printed wiring board having at least one plated through hole and an electroless copper deposit capable of withstanding 25 repetitive thermal cycles of immersion in water at 25° C. followed by immersion in a fluidized sand bed at 260° C. without failure or an increase of more than 10% in the resistance of the plated through hole, the electroless copper deposit having a trace iron concentration of less than 1.5 mg per mole of copper and a surface roughness of no greater than 1 micron.

2. A printed wiring board having at least one plated through hole and an electroless copper deposit, the electroless copper deposit being formed from a plating bath containing a copper compound, ethylenediamine tetraacetic acid as a complexing agent for the copper, a trace iron concentration of up to 125 mg per mole of copper, a pH adjusting agent, an additive selected from the group consisting of soluble inorganic silicon compounds and soluble inorganic germanium compounds, and an oxygen-containing gas injected thereinto, the electroless copper deposit being capable of withstanding 25 repetitive thermal cycles of immersion in water at 25° C. followed by immersion in a fluidized sand bed at 260° C. without failure or an increase of more than 10% in the resistance of the plated through hole.

3. The printed wiring board of claim 2 wherein the plating bath further comprises a complexing agent for iron in an amount sufficient to limit codeposited iron in the electroless copper deposit to less than 1.5 mg per mole of copper.

4. The printed wiring board of claim 2 wherein the plating bath further comprises a soluble inorganic vanadium compound in an amount sufficient to reduce the roughness of the surface of the electroless copper deposit to no greater than 1 micron.

5. The printed wiring board of claim 2 wherein the plating bath further comprises the pH adjusting agent in an amount sufficient to maintain the pH of the plating bath in the range 11.2 to 12 when measured at 25° C.

6. The printed wiring board of claim 2 wherein the plating bath further comprises a soluble inorganic vanadium compound in an amount sufficient to increase the ductility of the electroless copper deposit and enable the electroless copper deposit to withstand 30 of the repetitive thermal cycles.

7. A printed wiring board having at least one plated through hole, the hole wall comprising an electroless copper deposit formed from a plating bath containing a copper compound, ethylenediamine tetraacetic acid as a complexing agent for the copper, a trace iron concentration of up to 125 mg per mole of copper, a pH adjusting agent, an additive selected from the group of soluble inorganic silicon compounds and soluble inorganic germanium compounds, and an oxygen-containing gas injected thereinto, the electroless copper deposit being capable of withstanding 25 repetitive thermal cycles of immersion in water followed by immersion in a fluidized sand bed at 260° C. without failure or an increase of more than 10% in the resistance of the plated through hole.

8. The printed wiring board of claim 7 wherein the plating bath further comprises a complexing agent for iron in an amount sufficient to limit codeposited iron in the electroless copper deposit to less than 1.5 mg per mole of copper.

9. The printed wiring board of claim 7 wherein the plating bath further comprises a soluble inorganic vanadium compound in an amount sufficient to reduce the roughness of the surface of the electroless copper deposit to no greater than 1 micron.

10. The printed wiring board of claim 7 wherein the plating bath further comprises the pH adjusting agent in an amount sufficient to maintain the pH of the plating bath in the range 11.2 to 12 when measured at 25° C.

11. The printed wiring board of claim 7 wherein the plating bath further comprises a soluble inorganic vanadium compound in an amount sufficient to increase the ductility of the formed electroless copper deposit and enable the electroless copper deposit to withstand 30 of the repetitive thermal cycles.

* * * * *